United States Patent
Leistiko et al.

(10) Patent No.: US 9,524,927 B1
(45) Date of Patent: Dec. 20, 2016

(54) STRUCTURES, ARCHITECTURES, SYSTEMS, METHODS, ALGORITHMS AND SOFTWARE FOR CONFIGURING AN INTEGRATED CIRCUIT FOR MULTIPLE PACKAGING TYPES

(71) Applicant: Marvell International Ltd., Hamilton (BM)

(72) Inventors: Tyson Leistiko, Sunnyvale, CA (US); Huahung Kao, San Jose, CA (US); Wayne A. Loeb, San Francisco, CA (US)

(73) Assignee: Marvell International Ltd., Hamilton (BM)

( * ) Notice: Subject to any disclaimer, the term of this patent is extended or adjusted under 35 U.S.C. 154(b) by 318 days.

(21) Appl. No.: 13/850,144

(22) Filed: Mar. 25, 2013

Related U.S. Application Data

(63) Continuation of application No. 11/867,615, filed on Oct. 4, 2007, now Pat. No. 8,405,220, which is a continuation-in-part of application No. 11/372,865, filed on Mar. 9, 2006, now Pat. No. 7,586,199.

(60) Provisional application No. 60/828,492, filed on Oct. 6, 2006, provisional application No. 60/729,107, filed on Oct. 21, 2005, provisional application No.
(Continued)

(51) Int. Cl.
| | |
|---|---|
| *H01J 5/56* | (2006.01) |
| *H01K 1/00* | (2006.01) |
| *H01L 23/495* | (2006.01) |
| *H01L 23/00* | (2006.01) |

(52) U.S. Cl.
CPC ............ *H01L 23/4952* (2013.01); *H01L 24/11* (2013.01)

(58) Field of Classification Search
CPC ............ H01L 2924/00014; H01L 2924/00013; H01L 2224/05166; H01L 2224/05186; H01L 2224/05647; H01L 2224/0345; H01L 2224/03452; H01L 2224/0361; H01L 2224/05124; H01L 2224/05138; H01L 2224/05147
See application file for complete search history.

(56) References Cited

U.S. PATENT DOCUMENTS

| | | |
|---|---|---|
| 5,328,078 A | 7/1994 | Okumura |
| 5,707,894 A | 1/1998 | Hsiao |
| (Continued) | | |

OTHER PUBLICATIONS

U.S. Appl. No. 13/154,180, filed Jun. 6, 2011, Tyson Leistiko et al., "Structures, Architectures, Systems, Methods, Algorithms and Software for Configuring an Integrated Circuit for Multiple Packaging Types".

*Primary Examiner* — Meiya Li

(57) ABSTRACT

Structures, architectures, systems, an integrated circuit, methods and software for configuring an integrated circuit for multiple packaging types and/or selecting a packaging type for an integrated circuit. A structure generally includes a bump pad having a plurality of electrically disconnected bump pad sections, a plurality of bond pads each configured for electrical connection to one of the bump pad sections, and a plurality of conductive traces, each adapted to electrically connect one of the bond pads to the one bump pad section. A method generally includes the steps of forming the bump pad, the bond pads, and the conductive traces from an uppermost metal layer, and forming an insulation layer thereover. Another method generally includes forming the uppermost metal layer, and forming either a wire bond to at least one of the bond pads, or a ball bond or solder ball to electrically connect the bump pad section.

20 Claims, 11 Drawing Sheets

Related U.S. Application Data

60/724,690, filed on Oct. 7, 2005, provisional application No. 60/664,924, filed on Mar. 23, 2005.

(56) References Cited

U.S. PATENT DOCUMENTS

| | | | |
|---|---|---|---|
| 5,744,870 A | | 4/1998 | Casper |
| 5,787,098 A | * | 7/1998 | DasGupta et al. ............ 714/727 |
| 5,886,414 A | | 3/1999 | Galloway |
| 6,061,060 A | | 5/2000 | Berry et al. |
| 6,127,729 A | * | 10/2000 | Fukuda ................... H01L 22/34 257/208 |
| 6,324,754 B1 | * | 12/2001 | DiStefano ......... H01L 23/49838 228/180.22 |
| 6,577,017 B1 | | 6/2003 | Wong |
| 6,656,826 B2 | | 12/2003 | Ishimaru |
| 6,917,105 B2 | | 7/2005 | Alter |
| 7,034,402 B1 | | 4/2006 | Seshan |
| 7,098,540 B1 | | 8/2006 | Mohan et al. |
| 7,271,489 B2 | | 9/2007 | Lin et al. |
| 7,372,161 B2 | | 5/2008 | Lin et al. |
| 7,586,199 B1 | | 9/2009 | Leistiko et al. |
| 8,178,980 B2 | | 5/2012 | Jeng et al. |
| 2002/0025668 A1 | | 2/2002 | Ono |
| 2003/0045026 A1 | | 3/2003 | Fogal et al. |
| 2003/0141582 A1 | * | 7/2003 | Yang et al. .................... 257/686 |
| 2003/0234393 A1 | | 12/2003 | Cowles et al. |
| 2003/0235926 A1 | | 12/2003 | Knollenberg et al. |
| 2003/0235929 A1 | | 12/2003 | Cowles et al. |
| 2004/0007778 A1 | | 1/2004 | Shinozaki et al. |
| 2004/0070042 A1 | | 4/2004 | Lee et al. |
| 2005/0048695 A1 | | 3/2005 | Chia et al. |
| 2005/0121804 A1 | * | 6/2005 | Kuo ....................... H01L 22/32 257/781 |
| 2006/0016861 A1 | | 1/2006 | Daubenspeck et al. |
| 2006/0060961 A1 | | 3/2006 | Lin et al. |
| 2006/0131748 A1 | | 6/2006 | Seshan |
| 2007/0041632 A1 | | 2/2007 | Enokido et al. |

\* cited by examiner

STRUCTURES, ARCHITECTURES, SYSTEMS, METHODS, ALGORITHMS AND SOFTWARE FOR CONFIGURING AN INTEGRATED CIRCUIT FOR MULTIPLE PACKAGING TYPES

RELATED APPLICATIONS

The present disclosure is a continuation of and claims priority to U.S. patent application Ser. No. 11/867,615, filed Oct. 4, 2007, now U.S. Pat. No. 8,405,220, issued Mar. 26, 2013, which claims the benefit of U.S. Provisional Application No. 60/828,492, filed Oct. 6, 2006, and which is a continuation-in-part of U.S. patent application Ser. No. 11/372,865, filed Mar. 9, 2006, now U.S. Pat. No. 7,586,199, issued Sep. 8, 2009, which claims the benefit of U.S. Provisional Application No. 60/729,107, filed Oct. 21, 2005, U.S. Provisional Application No. 60/724,690, filed Oct. 7, 2005, and U.S. Provisional Application No. 60/664,924, filed Mar. 23, 2005, which are incorporated herein by reference.

FIELD

The present disclosure generally relates to the field of semiconductor and/or integrated circuit packaging. More specifically, embodiments of the present invention pertain to structures, methods, algorithms and software for configuring an integrated circuit for multiple packaging types and/or selecting one of a plurality of packaging types for an integrated circuit.

BACKGROUND

Integrated circuits are widely available in a number of well-known packaging types, including wire-bonded lead packages (e.g., flat packs), ball grid arrays (BGAs; e.g., fine pitch BGAs). Frequently, manufacturers or suppliers of semiconductor and/or integrated circuit products (hereinafter, "integrated circuit(s)" or "ICs") may wish to provide ICs otherwise having the same functionality and density in different packaging types. However, in general, such functionally identical ICs having different packaging types have, at least in part, a different product number and a different manufacturing flow. Usually, this is due to a perceived need to use a different mask for the uppermost level of metallization in order to form connections between pads on the IC to structures (e.g., ball bonds or wire bonds) that communicate with external devices.

For example, FIG. 1 shows a top-down view of an IC 100 having bond pads 110a-110z configured for wire bonding. In such a configuration, the wire bonds often have a sufficient inductance due to their length and/or proximity to other wires to induce cross-talk in neighboring wires. The wires can also act as small antennae, and thus be inadvertently affected by signals on nearby wires or other external sources. As a result, it is a common practice in wire-bonded IC packages to use several wire bonds to carry a common signal. Typically, this practice is used for power and ground wires, where even small fluctuations in the level of the signal can have dramatic effects in IC functions.

On the other hand, FIG. 2 shows a functionally identical IC 200 having bump pads 210a-210z configured for ball bonding. As is readily apparent, the locations of bump pads 210a-210z are not, as a whole, identical to the locations of bond pads 110a-110z in the IC 100 of FIG. 1, even though the functional circuitry is generally identical between IC 100 and IC 200. Also, the balls (or bumps) that form ball bonds generally do not have an appreciable or significant inductance, so ball bonds generally do not have an appreciable function or action as an antenna. Thus, a single ball bond can carry a power supply or ground signal to a particular location in IC 200, as opposed to the multiple wire bonds used in IC 100 of FIG. 1. Thus, the connection requirements (e.g., input and/or output signals and/or the descriptions thereof) may differ with different packaging options.

As a result, traditionally, two (or more) different versions of ICs are created when different packaging types are desired. This adds the cost of at least one additional mask to produce the different packaging version of the device. It also complicates product inventory management, as the IC packaging decision has to be made at the beginning of wafer production. A need therefore exists to create a single design and/or layout that provides the ability to select one of a number of different packaging types, which will, in turn, reduce the number of masks in making a related family of products, reduce manufacturing costs, simplify product inventory management, and enable greater flexibility with regard to meeting market demands for products having a certain packaging type.

SUMMARY

Embodiments of the present invention relate to structures, architectures, systems, methods, algorithms and software for configuring an integrated circuit for multiple packaging types and/or selecting one of a plurality of packaging types for an integrated circuit. The structure generally comprises a bump pad comprising a plurality of electrically disconnected bump pad sections, a plurality of bond pads each configured for electrical connection to a bump pad section, and a plurality of conductive traces each adapted to electrically connect one of the bond pads to a corresponding bump pad section. In one implementation, each bond pad that is configured for electrical connection to a bump pad section is connected to a unique bump pad section. The architectures and/or systems generally comprise those that include a structure, circuit or layout embodying one or more of the inventive concepts disclosed herein.

If a ball bond or solder ball is not attached to the bump pad, the sections of the bump pad are not connected electrically, and an IC containing the structure remains configured for wire bond packaging. By attaching a ball bond or solder ball to the bump pad, the IC may be configured for ball bond packaging. Thus, embodiments of the present invention provide a structure for enabling multiple packaging options in a single design, layout and/or mask set (other than a pad opening mask).

In one embodiment, the structure further comprises a solder bump or solder ball on the bump pad, electrically connecting each of the bump pad sections to each other. In certain implementations, the structure further comprises a plurality of bumping metal layer sections on or over the bump pad. For example, each of the plurality of bumping metal layer sections may correspond to a unique bump pad section of the bump pad.

Alternatively, the structure may further comprise a wire bond to at least one of (and in one implementation, to each of) the plurality of bond pads. In this alternative embodiment, the structure generally further comprises a plurality of input/output circuits and/or a plurality of circuit protection devices, each input/output circuit electrically communicating with a unique one of the bond pads, and each circuit protection device electrically communicating with at least one of the bond pads.

Another embodiment of the present invention further relates to an integrated circuit or semiconductor device, comprising the present structure and a substrate physically supporting the structure. Generally, the integrated circuit or semiconductor device further comprises a plurality of integrated circuit components or semiconductor devices thereon and/or a packaging material surrounding the substrate and the structure.

Alternatively, the structure may comprise one or more means for attaching a solder ball to an integrated circuit, a plurality of means for attaching a wire bond to the integrated circuit, and a plurality of means for electrically connecting one of the means for attaching a wire bond to a section of the means for attaching a ball bond or solder ball. Each ball bond/solder ball attaching means comprises a plurality of electrically disconnected bump pad sections, and each wire bond attaching means is configured for electrical connection to the ball bond/solder ball attaching means.

The method of manufacturing or making the structure generally comprises the steps of forming, from an uppermost metal layer on a device, a bump pad comprising a plurality of electrically disconnected bump pad sections, a plurality of bond pads, each configured for electrical connection to one of the bump pad sections, and a plurality of conductive traces, each adapted to electrically connect one of the bond pads to the one bump pad section; and forming an insulation layer over the uppermost metal layer. In general, the insulation layer comprises an uppermost passivation layer, and the method further comprises forming an opening in the insulation layer over either the plurality of bond pads or the bump pad. However, in alternative embodiments, the method may further comprise forming a wire bond to at least a subset of the bond pads when the opening is over either plurality of bond pads, or forming a solder bump or solder ball on or over the bump pad when the opening is over either plurality of bump pad, thereby electrically connecting the plurality of bump pad sections. In one implementation, forming the bump pad comprises depositing a bumping metal onto the plurality of bump pad sections and forming one or more electrical disconnections in the bumping metal over the bump pad.

The method of selecting a packaging option generally comprises the steps of forming, from an uppermost metal layer on a device, a bump pad having a plurality of electrically disconnected sections, a plurality of bond pads each configured for electrical connection to one of the bump pad sections, and a plurality of conductive traces adapted to electrically connect one of the bond pads to one of the bump pad sections, and then forming either a wire bond to at least one of the bond pads or a ball bond on the bump pad, thereby electrically connecting the plurality of bump pad sections. In one embodiment, the bump pad comprises a bumping metal on a sectional ball bond pad, the bumping metal having one or more electrical disconnections therein over the ball bond pad. As for the method of manufacturing, the device generally further comprises an uppermost passivation layer over the uppermost metal layer, and the method of selecting a packaging option further comprises forming an opening in the uppermost passivation layer over either the plurality of bond pads or the bump pad before forming the wire bond, the ball bond or the solder ball. In general, forming the wire bond selects a wire bond packaging option, and forming the ball bond or the solder ball selects the ball bond packaging option.

The algorithm, computer program(s), waveform and/or software generally comprises a set of executable instructions configured to place a plurality of bond pads and a bump pad having a plurality of electrically disconnected sections in an upper metal layer, each such bond pad configured for electrical connection to one of the bump pad sections, and route a plurality of conductive traces in the upper metal layer, each trace adapted to electrically connect one of the bond pads to one of the bump pad sections. The program may further comprise one or more instructions to select a ball bond packaging option, in which case the computer program or waveform includes an instruction to form a solder bump or solder ball on or over the bump pad, thereby electrically connecting the plurality of bump pad sections. Alternatively, the program may further comprise one or more instructions to select a wire bond packaging option, in which case the computer program or waveform includes an instruction to form a wire bond to at least a subset of the bond pads.

In one embodiment, rather than using an under-bump metal to short disconnections on the redistribution layer(s) (e.g., a layer of conductive material deposited on an uppermost layer of metal, typically on a bond pad for subsequent formation of a wire bond or a ball bond thereon), if an under-bumping metal is present (e.g., in the uppermost layer of metal and/or in the first conductive layer of material formed thereon), the under-bumping metal preserves the disconnections in the bump pad with a small gap. The ball bond itself will adhere to or connect with each section of the bump pad and make the electrical connections with the plurality of bump pad sections itself. The advantage of this is that if an under-bump metal layer exists, the under-bump metal can be applied before the IC chips are designated for flip chip or bond wire packages. In this manner, the under-bump metal can be applied by either the wafer fab or the packaging house, whichever is most cost efficient at a given time.

Embodiments of the present invention advantageously provide reduced manufacturing costs by using a common mask for the level of metal (typically the uppermost such level) forming pads in various packaging options. Embodiments of the present invention also reduce inventory management issues by enabling one device to be manufactured at a wafer level for a plurality of different packaging options, thereby enabling packaging decisions to be made at a later time in the manufacturing process (e.g., immediately prior to packaging).

These and other advantages will become readily apparent from the detailed description of embodiments below.

Figure 1:
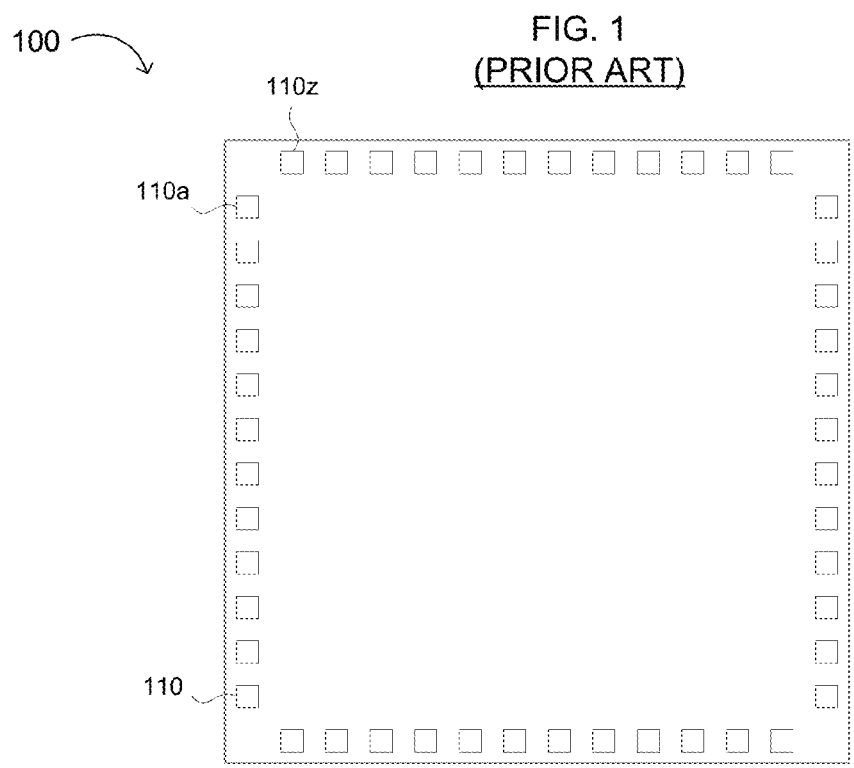
FIG. 1 is a diagram showing a top-down view of a conventional integrated circuit/semiconductor die configured for wire bonding.
Figure 2:
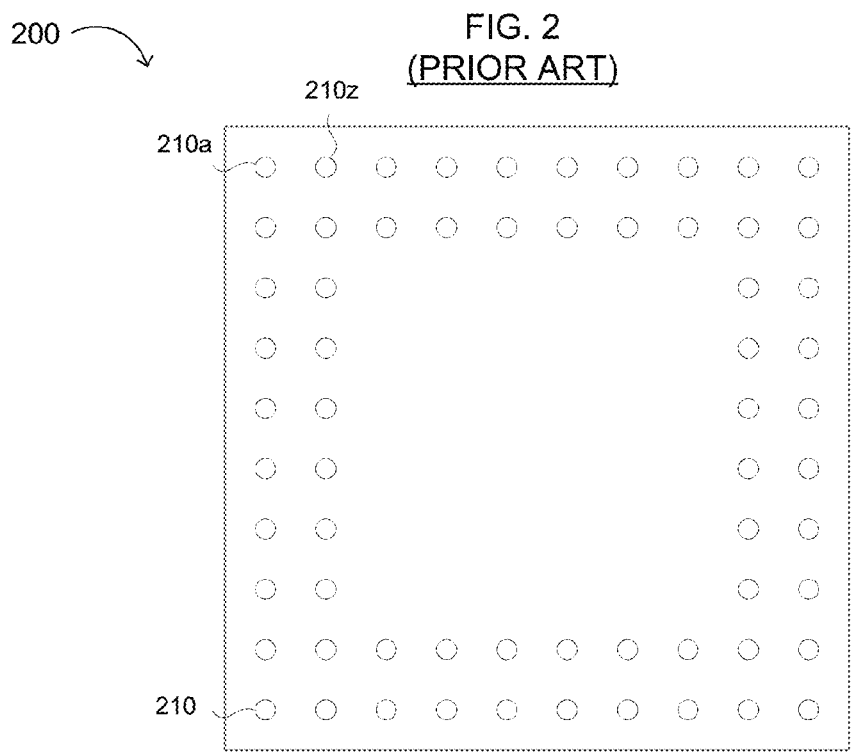
FIG. 2 is a diagram showing a top-down view of a conventional integrated circuit/semiconductor die configured for flip-chip ball bonding.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

Reference will now be made in detail to embodiments of the invention, examples of which are illustrated in the accompanying drawings. While aspects of the embodiments will be described, it will be understood that they are not intended to limit the embodiments. On the contrary, the embodiments of invention are intended to cover alternatives, modifications and equivalents that may be included within the spirit and scope of the invention as defined by the appended claims. Furthermore, in the following detailed description, numerous specific details are set forth in order to provide a thorough understanding of the embodiments of the present invention. However, it will be readily apparent to one skilled in the art that the embodiments of the present invention may be practiced without these specific details. In other instances, well-known methods, procedures, components, and circuits have not been described in detail so as not to unnecessarily obscure aspects of the embodiments of the present invention.

Unless specifically stated otherwise and/or as is apparent from the following discussions, throughout the present application, discussions utilizing terms such as "processing," "operating," "determining," "manipulating," "forming," or the like, refer to the action and processes of a controlled apparatus (generally a computer-controlled apparatus), processing system, circuit or similar processing device (e.g., a semiconductor manufacturing or packaging apparatus), that deposits, removes, manipulates and/or transforms materials or other physical structures on a substrate. Furthermore, for the sake of convenience and simplicity, the terms "solder bump" and/or "solder ball" are generally used interchangeably herein and are generally given their art-recognized meanings, but the use of one such term herein generally includes the other term. Also, for convenience and simplicity, the terms "connected to," "coupled with," "coupled to," and "in communication with" (which terms also refer to direct and/or indirect relationships between the connected, coupled and/or communication elements unless the context of the term's use unambiguously indicates otherwise) may be used interchangeably, but these terms are also generally given their art-recognized meanings.

The embodiments, in their various aspects, will be explained in greater detail below with regard to exemplary embodiments.

Exemplary Structures, Architectures and/or Layouts

In general, the structure comprises a disconnection in the bump pad and/or each of the plurality of conductive traces. In one embodiment (e.g., discussed below with regard to FIGS. 3-7B), the bump pad comprises a plurality of bump pad (or ball bond pad) sections connected to a plurality of bumping metal layer segments having an electrical disconnection (e.g., a gap) therebetween. In an alternative embodiment, (e.g., discussed below with regard to FIGS. 8A-8D), the bump pad comprises a plurality of bump pad sections without a bumping metal layer thereon. In general, regardless of whether or not a bumping metal layer is used, an electrical disconnection exists between at least first and second bump pad sections, which can be shorted by attaching a ball bond to the sectional bump pad.

Figure 3:
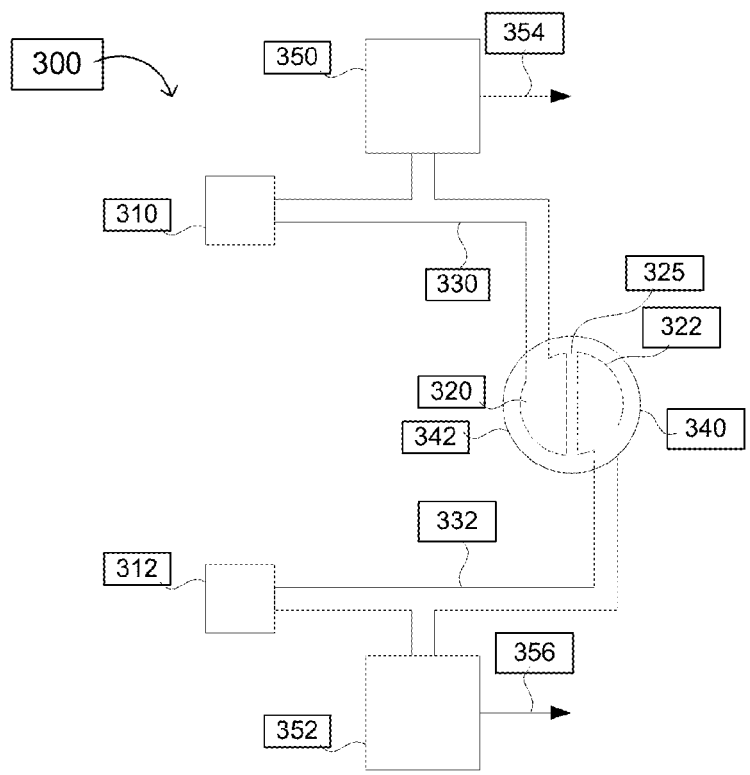
FIG. 3 is a diagram showing a top-down view of a first embodiment of the present invention.

FIG. 3 shows an exemplary structure 300 comprising a first bumping metal layer section 340 and a second bumping metal layer section 342, on and/or over the bump pad region generally defined by bump pad sections 320-322 (and designated, at least in part, by dashed lines). A bump pad region is generally a location on the IC where a solder bump or solder ball (also referred to herein as a "ball bond") may be subsequently formed. Thus, the present structure may further comprise a solder bump or solder ball on or over the bump pad. In this case, because the bump pad region and the bond pads (e.g., 310 and 312) are on the same surface of the IC, the bump pads are generally configured for flip-chip ball bonding. In addition, structure 300 generally comprises a plurality of bond pads 310 and 312, each having a conductive trace (330 and 332, respectively) electrically connecting it to one of bump pad sections 320 or 322, respectively. As shown, each bond pad is electrically connected to a unique bump pad section. Like bumping metal layer sections 340 and 342, the bump pad sections 320 and 322 have one or more disconnections 325 therebetween.

As is conventional in the art, exemplary structure 300 may further contain conventional input and/or output circuits 350 and 352. Each input/output circuit 350 and 352 is in electrical communication with one of the bond pads (310 and 312, respectively), via a conductive trace (330 and 332, respectively). Typically, input/output circuits 350 and 352 are placed (or laid out) in relatively close proximity to bond pads 310 and 312. Depending on the exact placement of the bump pad region 320-322, input/output circuits 350 and 352 may or may not be placed in close proximity thereto. Typically, input/output circuits 350 and 352 are farther away from the bump pad region 320-322 than from bond pads 310 and 312. As a result, any electrical disconnection (effectively between bond pads and the corresponding I/O circuits) is located in, or relatively close to, the bump pad region 320-322 (e.g., disconnection 325).

When input/output circuits 350 and 352 are configured as input and/or input/output buffers, they may provide an input signal (354 and 356, respectively) to the internal devices and/or circuitry of the IC. Additionally or alternatively, input/output circuits 350 and 352 may further include or be configured as circuit protection devices, in which case each of the bond pads 310 and 312 may be in electrical communication with at least one of the circuit protection devices (e.g., 350 and 352, respectively). In one alternative (not shown in FIG. 3), a single circuit protection device can be in electrical communication with more than one (e.g., adjacent) bond pads. Thus, when a wire bond is subsequently formed to a bond pad (e.g., bond pad 310), the signal carried on the wire bond is automatically in communication with input/output circuit 350.

Figure 4:
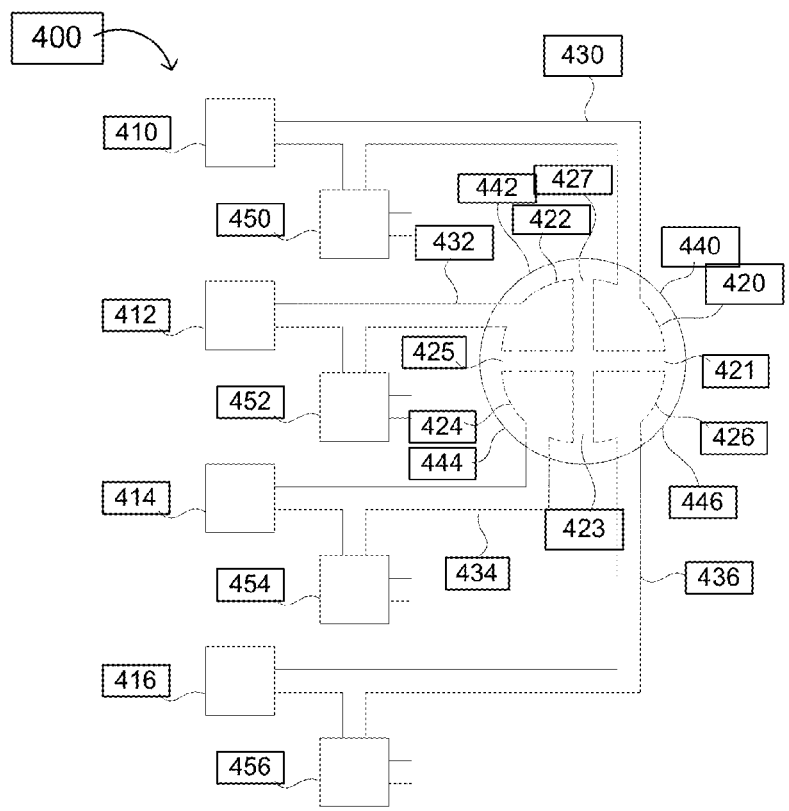
FIG. 4 is a diagram showing a top-down view of a second embodiment of the present invention.

FIG. 4 shows a second exemplary structure 400, comprising a plurality of bumping metal layer sections 440-446 on and/or over the bump pad region generally defined by bump pad sections 420, 422, 424 and 426 (and designated, at least in part, by dashed lines). In addition, structure 400 generally comprises a plurality of bond pads 410, 412, 414 and 416, each having a conductive trace (430, 432, 434 and 436, respectively) electrically connecting it to one of bump pad sections 420, 422, 424 and 426, respectively. The bump pad sections 420, 422, 424 and 426 and bumping metal layer sections 440, 442, 444 and 446 have disconnection(s) 421, 423, 425 and 427 therebetween. Thus, the bump pad region may contain 2, 3, 4, or more bump pad sections, essentially up to the limit of such sections to which conductive traces can be formed, and over or on which a ball bond can be formed. Similar to the exemplary structure 300 in FIG. 3, exemplary structure 400 (FIG. 4) may further contain conventional input and/or output circuits 450, 452, 454 and 456. Each input/output circuit 450, 452, 454 and 456 is in electrical communication with one of the bond pads (410, 412, 414 and 416, respectively), via a conductive trace (430, 432, 434 and 436, respectively).

As shown in FIGS. 3 and 4, the size, area or diameter of the bump region can vary, depending on the number of bump pad sections and the size (or pitch) of the ball bond formed thereon. For example, assuming bond pads 310-312 in FIG. 3 have substantially the same dimensions as bond pads 410-416 in FIG. 4, the bump pad region in FIG. 4 may have dimensions suitable for ball grid array (BGA) packaging, and the bump pad region in FIG. 3 may have dimensions suitable for fine pitch ball grid array (FPBGA) packaging. In fact, it is possible in embodiments of the present invention to configure the structure for three or more packaging options (e.g., a wire bond option and two or more ball bond options having different dimensions). In such a case, the different bump pad regions (or section[s] thereof) may overlap and/or be placed in different (e.g., separate or exclusive) locations.

Figure 5A:
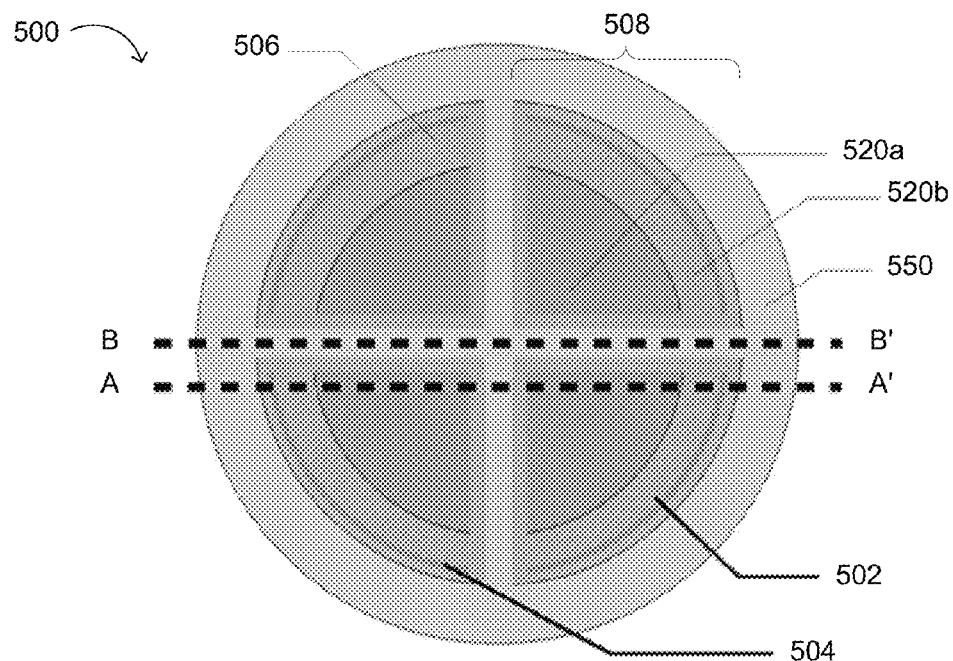
FIG. 5A is a top-down view of a bump pad according to an embodiment of the present invention.
Figure 5B:
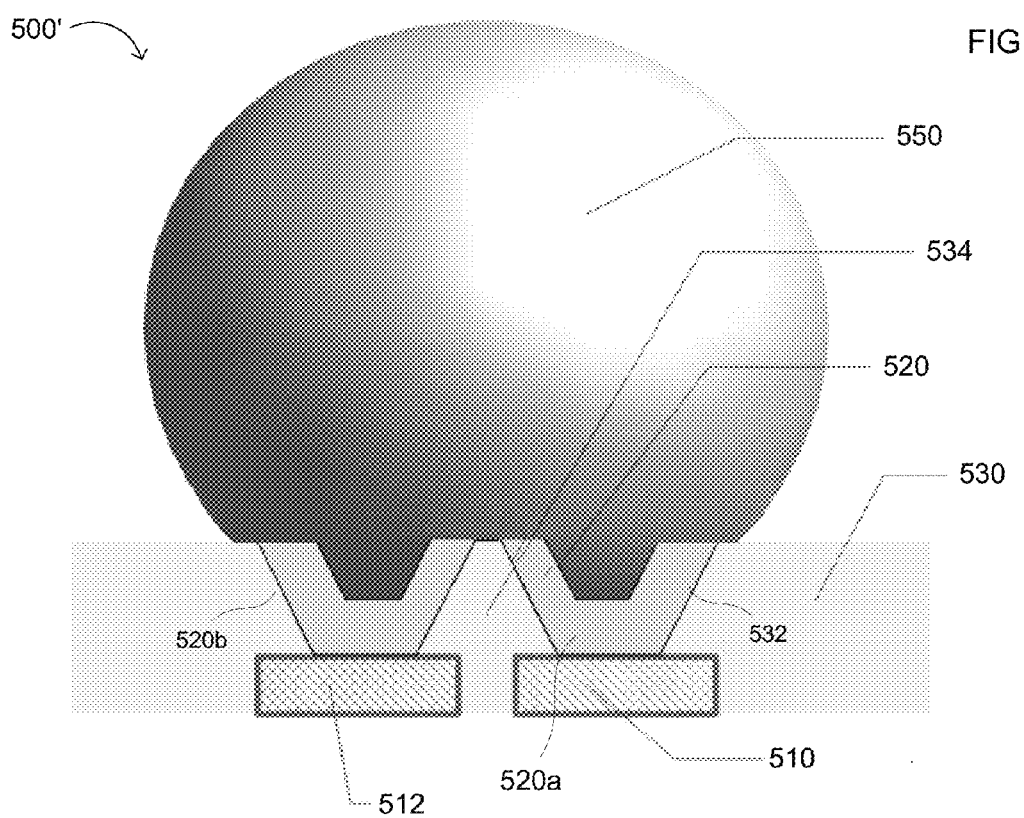
FIGS. 5B-5C show cross-sectional views of a first embodiment of the bump pad of FIG. 5A along lines A-A' or B-B', respectively, with a ball bond formed thereon.
Figure 5C:
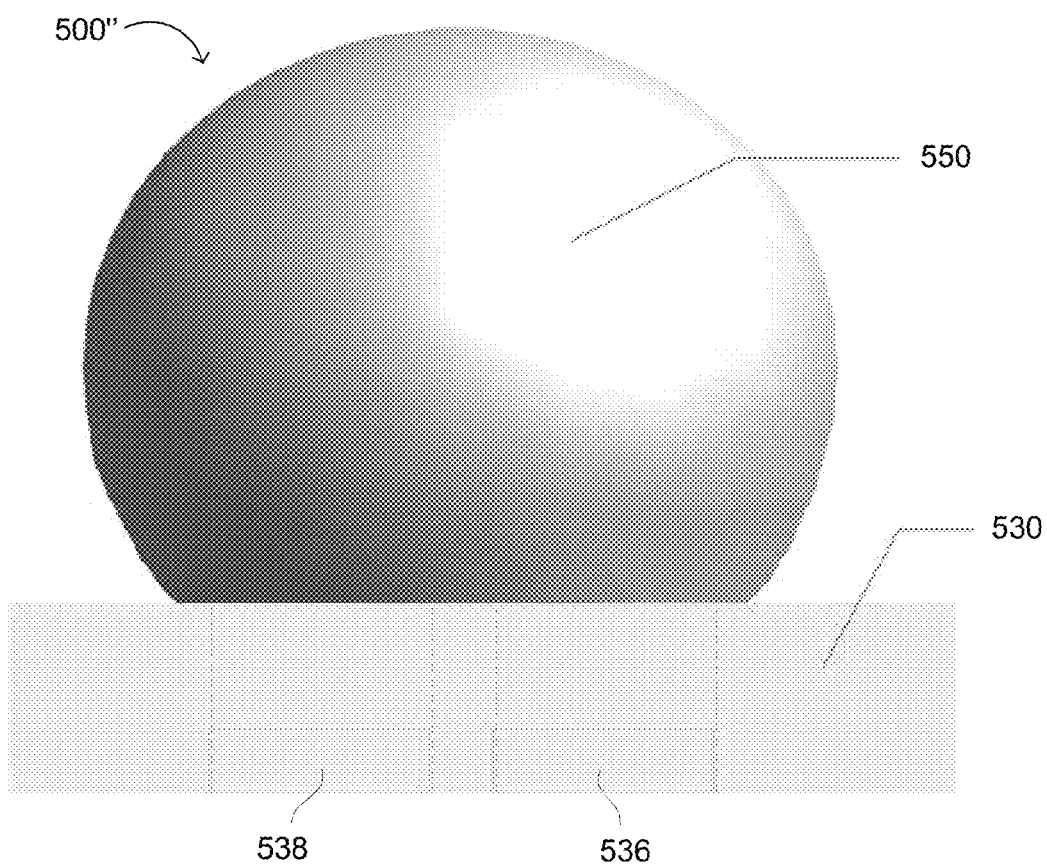

FIG. 5A is a top-down view of the bump pad region of the present structure, and FIGS. 5B-5C show cross-sections of the bump pad region of FIG. 5A having a ball bond thereon, along the A-A' axis and B-B' axis, respectively. For example, referring to FIG. 5A, bump pad region 500 comprises a bumping metal layer 520 split into four sections, covering first bump pad section 502, second bump pad section 504, third bump pad section 506, and fourth bump pad section 508. Between the different portions or sections of the bumping metal layer 520 are located disconnections 532 and 534, generally comprising an insulating layer in the structure under the bumping metal layer 520. For example, a bumping metal layer portion 520a may be in direct contact with an underlying bump pad section (e.g., 510 in FIG. 5B), and another bumping metal layer portion 520b may be in contact with a second underlying bump pad section (e.g., 512 in FIG. 5B). An electrical disconnection 532, comprising a section of the underlying insulation or passivation layer having an exposed upper surface, may be between (and in contact with) the two first bumping metal layer portion 520a and/or may be in direct contact with the two bump pad sections 510 and 512, as well as the two bumping metal layer portions 520a and 520b (FIGS. 5A-5B).

FIG. 5B shows a cross-sectional view of the bump pad region 500 of FIG. 5A along the A-A' axis, but further comprising a ball bond 550 thereon, in accordance with a first embodiment of this invention. Bump pad/ball bond region 500' (FIG. 5B) shows a first bump pad section 510, a second bump pad section 512, bumping metal layer sections 520a-520b, a passivation or insulation layer 530, a disconnection 534, and a ball bond (or solder bump) 550. First and second bump pad sections 510 and 512 generally comprise the same layer of metal in the IC or semiconductor chip (e.g., the uppermost layer of metal). Such metal may comprise copper or aluminum. Disconnection 534 electrically isolates first bump pad section 510 from second bump pad section 512. Insulation layer 530 and disconnection 534 generally comprise the outermost layer of insulation, and may comprise or be selected from silicon oxide, silicon nitride, silicon oxynitride, or a laminate or combination thereof (e.g., silicon nitride over silicon oxide).

The bumping metal layer 520 is conventional, and may comprise one or more materials conventionally used to interface (or provide a reliable electrical connection) between bump pad sections 510-512 and ball bond 550. Thus, bumping metal layer 520 may comprise a lower adhesive layer (e.g., titanium [Ti], tantalum [Ta], silicon [Si] or aluminum [Al]), and an outermost barrier layer (e.g., of titanium nitride [TiN], tantalum nitride [TaN], tungsten nitride [WN], or an alloy of titanium-tungsten [TiW] or nickel-vanadium [NiV]) and/or ball bond adhesion promoter (e.g., nickel [Ni], copper [Cu] or Cu alloy, silver [Ag] or gold [Au]). However, as can be seen in FIG. 5B, bumping metal layer 520 electrically connects the various bump pad sections (e.g., first and second bump pad sections 510 and 512 in FIG. 5B, and first through fourth bump pad sections 502, 504, 506 and 508 in FIG. 5A) to each other, thereby enabling transmission of a single external signal (or a single power supply, reference voltage or reference signal such as a clock) to multiple input or input/output circuits or circuit blocks (see FIGS. 3-4).

Referring to FIG. 5B, the first bumping metal layer 520 is divided into first and second bumping metal layer sections 520a-520b. The first bumping metal layer section 520a is connected to the first bump pad section 510 at a first lower bumping metal layer portion, and the second bumping metal layer section 520b is connected to the second bump pad section 512 at a second lower bumping metal layer portion. A gap or disconnect 534 is formed between the first and second bumping metal layer sections 520a and 520b. The disconnect 534 electrically isolates the first bumping metal layer section 520a from the second bumping metal layer section 520b. The ball bond 550 is then formed on the first and second bumping metal layer sections 520a, 520b to connect the first and second bumping metal layer sections 520a and 520b with each other. Forming a disconnect 534 between the first and second bumping metal layer sections 520a and 520b provides the advantage of allowing the bumping metal layer 520 to be applied before the integrated circuit chip is designated for flip chip or bond wire packages. In this way, the bumping metal layer 520 can now be applied by the Fab or the packaging house, for example.

Ball bond 550 is also conventional, and may contain, for example, a conventional lead-free solder material (e.g., a tin [Sb]-silver [Ag]-copper [Cu] alloy containing from 90 to 98% Sb, 1.8 to 8% Ag, and from 0.2-2% Cu (percentages being by weight, volume or moles/atoms).

FIG. 5C shows a cross-sectional view of the bump pad region 500 of FIG. 5A along the B-B' axis, further comprising ball bond 550 thereon. Bump pad/ball bond region 500" (FIG. 5C) shows ball bond 550 and disconnections 536, 538 in insulation layer 530. In this case, insulation layer 530 contains second and third disconnections 536 and 538, electrically isolating first bump pad section 502 from fourth bump pad section 508 (see FIG. 5A) and second bump pad section 504 from third bump pad section 506, respectively.

Figure 5D:
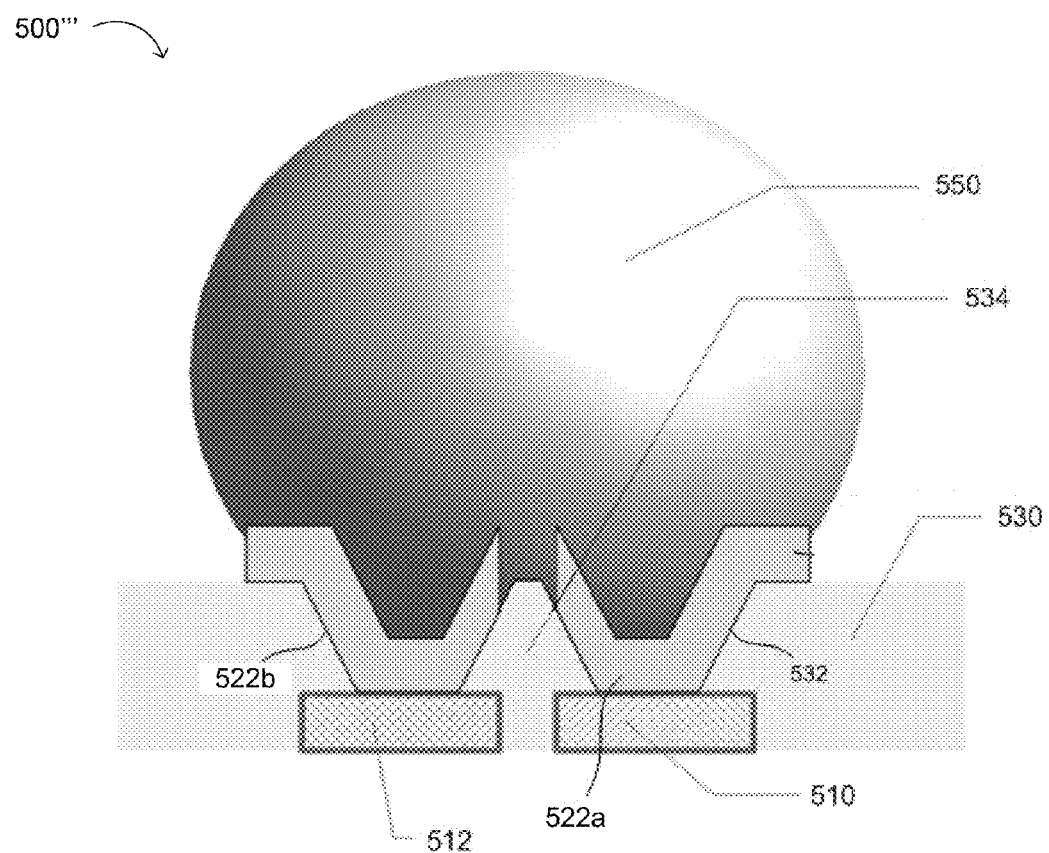
FIG. 5D shows a cross-sectional view of a second embodiment of the bump pad of FIG. 5A along lines A-A', with a ball bond formed thereon.

FIG. 5D shows a cross-sectional view of an alternative embodiment of bump pad region 500 of FIG. 5A along the A-A' axis, further comprising a ball bond 550 thereon, in accordance with a second embodiment of this invention. Bump pad/ball bond region 500''' (FIG. 5D) shows a first bump pad section 510, a second bump pad section 512, a first bumping metal layer section 522a, a second bumping metal layer section 522b, a passivation or insulation layer 530, a disconnection 534, and a ball bond (or solder bump) 550. First and second bump pad sections 510 and 512 generally comprise the same layer of metal in the IC or semiconductor chip (e.g., the uppermost layer of metal). Such metal may comprise copper or aluminum. Disconnection 534 electrically isolates first bump pad section 510 from second bump pad section 512. Insulation layer 530 and disconnection 534 generally comprise the outermost layer of insulation, and may comprise or be selected from silicon oxide, silicon nitride, silicon oxynitride, or a laminate or combination thereof (e.g., silicon nitride over silicon oxide).

The bumping metal layer 522, comprising the first bumping metal layer section 522a and the second bumping metal layer section 522b, is conventional, and may comprise one or more materials conventionally used to interface (or provide a reliable electrical connection) between bump pad sections 510-512 and ball bond 550. Thus, bumping metal 522 may comprise a lower adhesive layer (e.g., titanium [Ti], tantalum [Ta], silicon [Si] or aluminum [Al]), and an outermost barrier layer (e.g., of titanium nitride [TiN], tantalum nitride [TaN], tungsten nitride [WN], or an alloy of titanium-tungsten [TiW] or nickel-vanadium [NiV]) and/or ball bond adhesion promoter (e.g., nickel [Ni], copper [Cu] or Cu alloy, silver [Ag] or gold [Au]). However, as can be seen in FIG. 5D, bumping metal layer sections 522 may have each have a small portion that overlies a substantially planar surface of insulation layer 530. Ball bond 550 electrically connects the various bump pad sections (e.g., first and second bump pad sections 510 and 512 in FIG. 5D, and first through fourth bump pad sections 502, 504, 506 and 508 in FIG. 5A) to each other, thereby enabling transmission of a single external signal (or a single power supply, reference voltage or reference signal such as a clock) to multiple input or input/output circuits or circuit blocks.

Referring to FIG. 5D, the first bumping metal layer 522 is divided into first and second bumping metal layer sections 522a and 522b. The first bumping metal layer section 522a is connected to the first bump pad section 510, and the second bumping metal layer section 522b is connected to the second bump pad section 512. A gap or disconnection is formed between the first and second bumping metal layer sections 522a and 522b. The gap electrically isolates the first bumping metal layer section 522a from the second bumping metal layer section 522b. The ball bond 550 is then formed on the first and second bumping metal layer sections 522a and 522b to electrically connect the first and second bump pad sections 510 and 512 with each other. Forming a gap 534 between the first and second bumping metal layer sections 522a, 522b provides the advantage of allowing the bumping metal layer 522 to be applied before the integrated circuit chip is designated for flip chip or bond wire packages. In this way, the bumping metal layer 522 can be applied by either the Fab or the packaging house, for example.

An Exemplary Method of Making the Structure

FIGS. 6A-6F show cross-sectional views of an exemplary structure during various stages of a first exemplary manufacturing method in which a ball bond packaging option (e.g., BGA, FPBGA, etc.) is selected. Generally, the cross-sectional views show a cross-section of the structure 500' in FIG. 5B (i.e., a first embodiment of the structure 500 in FIG. 5A, taken along the A-A' axis). However, FIGS. 6A-6F focus on a first method of manufacturing (or making) a structure having a plurality of available packaging options.

Figure 6A:
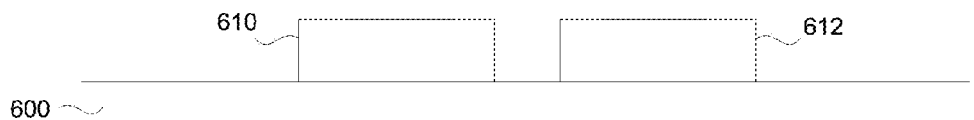
FIGS. 6A-6F show cross-sectional views of an IC during various stages of manufacturing the bump pad and ball bond of FIGS. 5A-5C, and FIGS. 6G-6I show cross-sectional views of an IC during various stages of manufacturing a bond pad of FIG. 3.

Referring now to FIG. 6A, first and second bump pad sections 610 and 612 may be formed by depositing, then photolithographically patterning and etching, a layer of metal on substrate 600. A wire bond pad (not shown) may be formed at the same time. Substrate 600 generally comprises an outer (or exposed) insulator layer, under which or adjacent to which may be located active circuit components, such as busses, conductive (metal) traces, resistors, fuses, etc., in addition to input/output and/or protective circuitry as explained above. As shown in FIG. 6A, the metal may comprise aluminum and may be deposited by sputtering. Alternatively, first and second bump pad sections 610 and 612 may be formed by damascene metal formation (e.g., patterning and etching an upper insulator layer in substrate 600), in which case the bulk metal may comprise copper (and the structure will not appear identical to that shown in FIG. 6A).

Figure 6B:
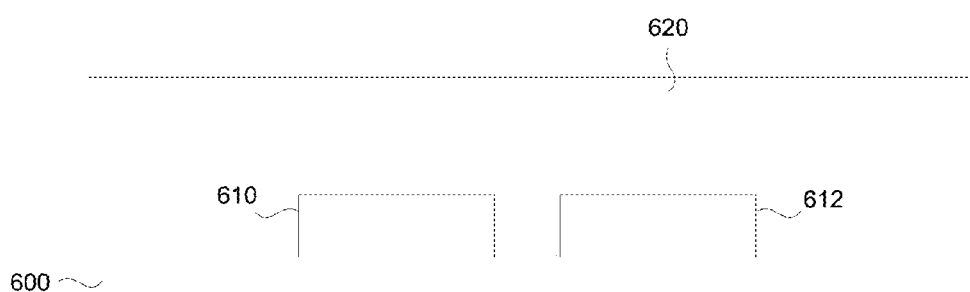

As shown in FIG. 6B, an insulator or passivation layer 620 (as described above for insulator layer 530) is deposited onto the structure in FIG. 6A (generally by chemical vapor deposition [CVD], which may include plasma-enhanced CVD or high density plasma CVD). After deposition, the passivation layer 620 may be planarized (e.g., by polishing or CMP, reflow, etchback, etc.). At this point, the manufacturer still has all possible packaging options available, since no ball bond has been formed over the first and second bump pad sections 610 and 612. Also, after formation of the passivation layer 620, most (or all) conventional wafer manufacturing flows may be considered complete. Subsequent openings made in passivation layer 620 may be considered a first step in the packaging process, when such openings are formed at a packaging facility.

Figure 6C:
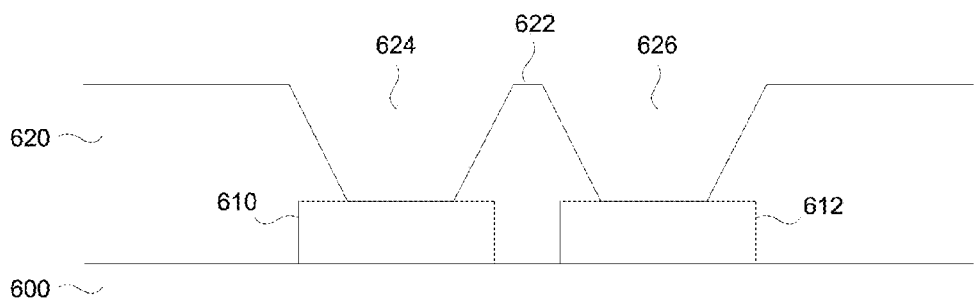

Then, as shown in FIG. 6C, openings 624 and 626 are formed in passivation layer 620, generally by conventional photolithography and etching. Similar openings are also formed over the bond pads for the wire bonding option (not shown). In the embodiment of FIG. 6C, openings 624 and 626 generally leave disconnection portion 622 in place (e.g., between first and second bump pad sections 610 and 612). In addition, openings 624 and 626 generally expose those bump pad sections to be electrically connected to each other and to corresponding bond pad sections (not shown). The slope of the sidewalls of openings 624 and 626 may be slightly exaggerated in the case of FIG. 6C. In many cases, the slope may be more perpendicular to the plane of first and second bump pad sections 610 and 612 (e.g., closer to the range of 80-87°). However, in most commercial applications, the slope of the sidewalls of the bump pad openings (e.g., 624 and 626) should be less than 90°, to provide a somewhat concave "cup" in which parts (or all) of a subsequent solder ball or solder bump may fit relatively securely.

At this point, the present method of making a structure having multiple packaging options may be substantially complete. From this point forward, the method of making is directed more towards making an IC having one of a plurality of packaging options. In general, one selects a packaging option by forming either (i) a wire bond to at least one of the bond pads, or (ii) a solder bump or solder ball on or over the bump pad.

Figure 6D:
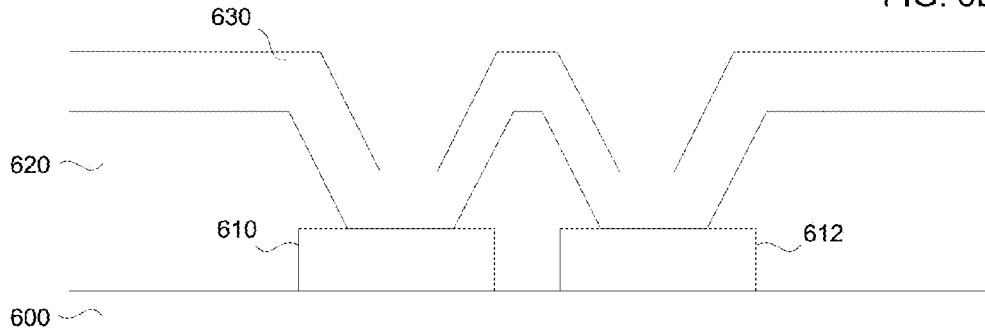

Referring now to FIG. 6D, a bumping metal layer 630 is formed by conventionally depositing one or more conventional bumping metal layers (generally by sputtering, CVD or ion metal plasma [IMP]-assisted deposition). Bumping metal layer 630 is similarly formed over the bond pads for wire bonding (not shown).

Figure 6E:
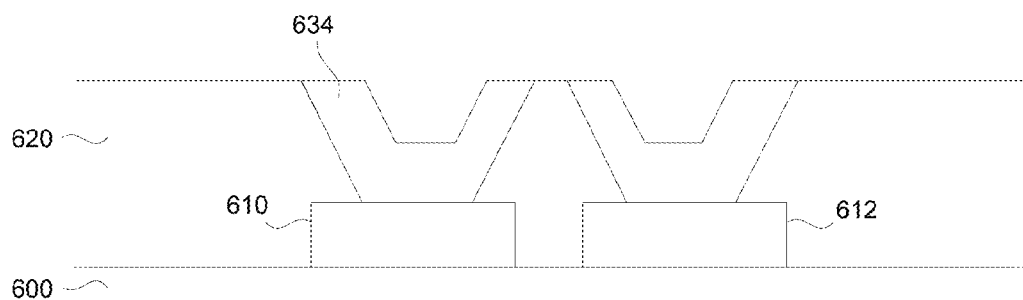

As shown in the embodiment of FIG. 6E, bumping metal layer sections 632 and 634 are formed by planarizing the bumping metal layer 630 (e.g., by chemical mechanical polishing [CMP], reflow, etchback, etc.) to form first and second bumping metal layer sections 632 and 634 on corresponding bump pad sections (e.g., 610 and 612) exposed by openings 624 and 626 (FIG. 6C) in passivation layer 620. The first and second bumping metal layer sections 632 and 634 further have a disconnection (e.g., 622) therebetween. The disconnection 622 (which may also be characterized as a gap) may be formed by planarizing the bumping metal layer until an upper surface of the underlying insulation or passivation layer 622 is exposed. Such planarization also removes bumping metal layer 630 from the uppermost (e.g., substantially horizontal and/or planar) surface of passivation layer 620 outside of the openings for the wire bonding bond pads (not shown).

Figure 6F:
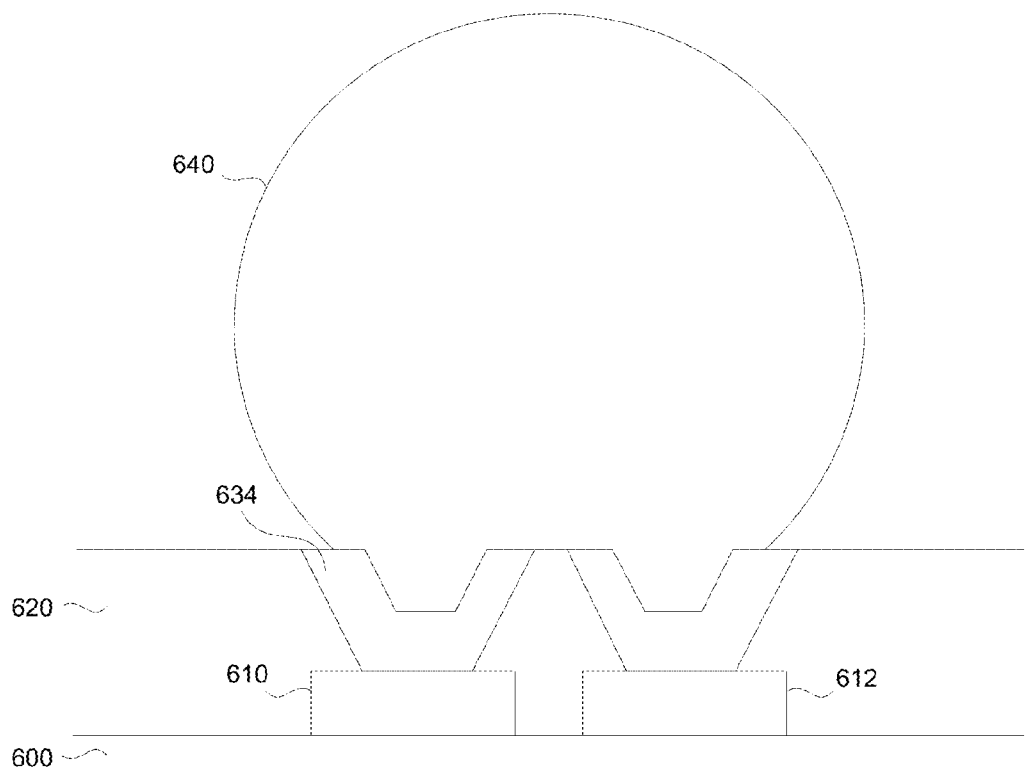

Finally, FIG. 6F shows the structure having a ball bond 640 conventionally attached thereto. As shown in FIG. 6F, ball bond 640 has a contact area with bumping metal layer sections 632 and 634 that may be greater than the exposed surface area of the first and second bump pad segments 610 and 612, contributing to the concave "cup" configuration in which parts of solder ball/solder bump 640 fit securely. Ball bond 640 connects the first and second bumping metal layer sections 632 and 634 so that they are electrically coupled or shorted.

Figure 6G:
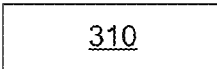
Figure 6H:
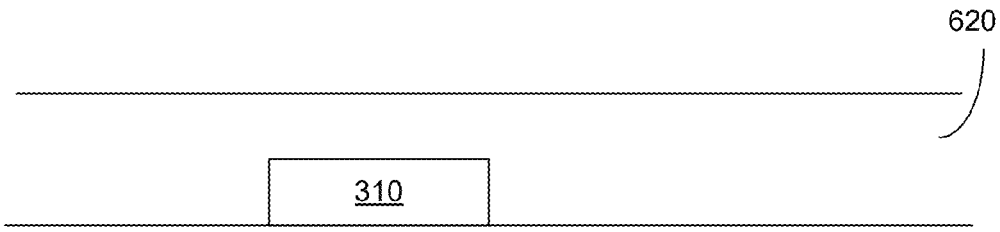
Figure 6I:
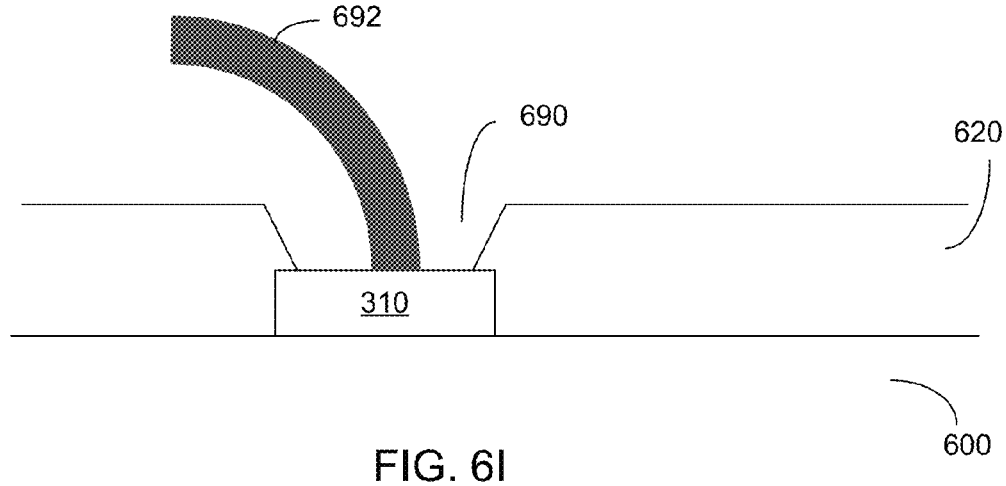

As mentioned above, one may also select a wire bond packaging option (e.g., a quad flat pack, multi-chip module, etc.) rather than forming the ball bond 640. Thus, in the present method of making a semiconductor device or IC having one of a plurality of packaging options, to select a wire bond packaging option, one simply uses the existing openings in the passivation layer 620 over at least one of the plurality of bond pads, then forms a wire bond to each of the exposed bond pads (e.g., between a bond pad and a corresponding lead of a lead frame). In many cases, openings will be formed to at least two of the plurality of bond pads, and in some cases, to all of the bond pads adapted to be electrically connected to the bump pad. For example, FIGS. 6A-6F show cross-sectional views of an exemplary structure during various stages of the first exemplary manufacturing method in which a bond pad packaging option is selected. FIG. 6G illustrates the bond pad 310 of FIG. 3 formed over the substrate 600. FIG. 6H illustrates the insulator or passivation layer 620 formed onto the bond pad 310 of FIG. 6G. FIG. 6I illustrates forming an opening 690 on the passivation layer 620 over the bond pad 310, and forming a wire bond (e.g., using a wire 692) to the bond pad 310. Additionally, to select a ball grid array packaging option, one simply forms a ball bond 640 over the exposed portions of the first and second segments 632 and 634 of the bumping metal layer 630.

A Second Exemplary Method of Manufacturing

Figure 7A:
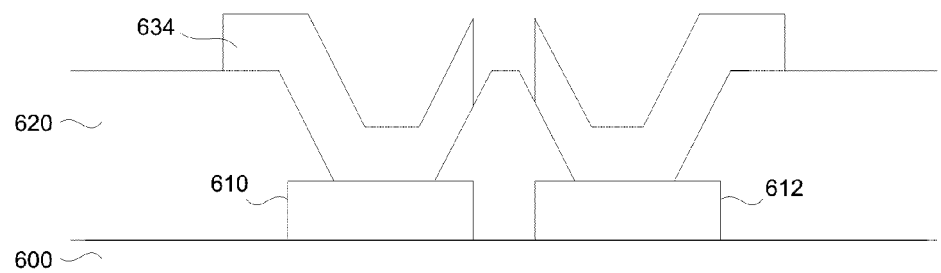
FIGS. 7A-7B show cross-sectional views of an IC during latter stages of an alternative embodiment for manufacturing the bump pad of FIG. 5D.
Figure 7B:
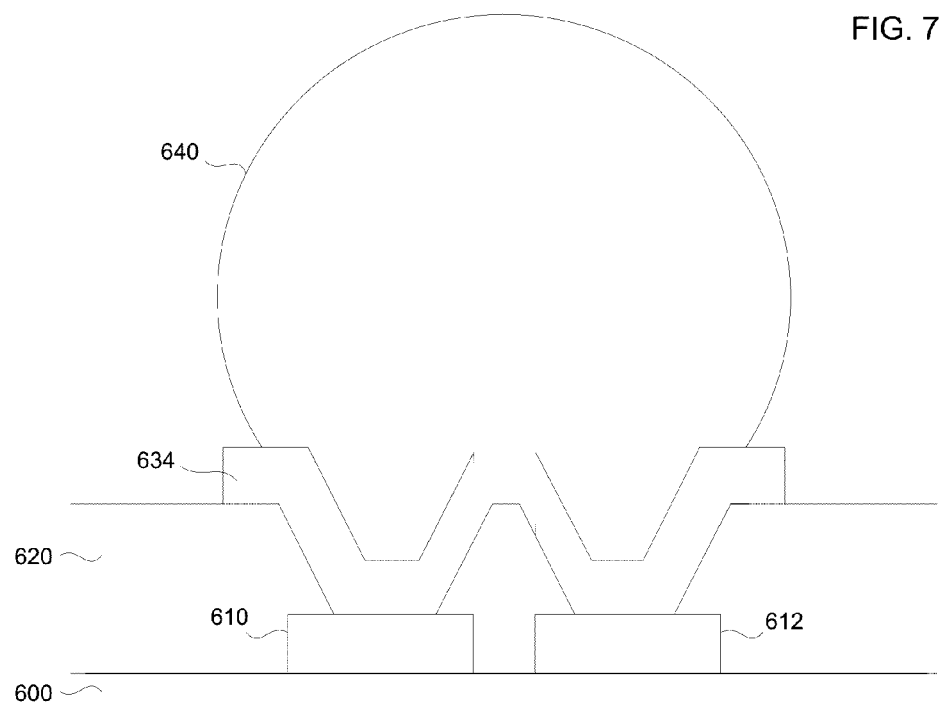

FIGS. 7A-7B shows a second embodiment of the present method of manufacturing, in which the gap between the first and second segments of the bumping metal layer is formed using a photolithographic patterning and etching process on the bumping metal layer(s) instead of a planarization process. FIGS. 7A-7B show cross-sectional views of an alternative exemplary structure to FIGS. 6D-6E during stages of an exemplary manufacturing method in which a ball bond packaging option is selected. Generally, the cross-sectional views show a cross-section of the structure 500' in FIG. 5D (i.e., a second embodiment of the structure 500 in FIG. 5A, taken along the A-A' axis). FIGS. 7A-B illustrate an alternative method of manufacturing a gap between first and second segments of the bumping metal layer after the structure shown in FIG. 6C is formed.

Referring now to FIG. 7A, a gap 665 in the bumping metal layer may be formed by depositing, then photolithographically patterning and etching, predetermined portions of the bumping metal layer. Upon forming the gap 665, the bumping metal layer is divided into first and second segments 632' and 634', having the gap 665 formed therebetween. The gap 665 electrically isolates the first segment 632' from the second segment 634' in much the same way and having same the benefits of the disconnection(s) and/or gap(s) discussed above.

Finally, FIG. 7B shows the structure having a ball bond 640 conventionally attached thereto. As shown in FIG. 6F, ball bond 640 has a contact area with bumping metal layer sections 632' and 634' that may be greater than the exposed surface area of the first and second bump pad segments 610 and 612, contributing to the concave "cup" configuration in which parts of solder ball/solder bump 640 fit securely. Ball bond 640 connects the first and second bump pad segments 610 and 612 so that they are electrically coupled or shorted.

A Third Exemplary Method of Manufacturing

FIGS. 8A-8D shows a third embodiment of the present structure, in which a disconnection portion 722 is formed between first and second bump pad sections 710 and 712 using an etch back process. FIGS. 8A-8D show cross-sectional views of an exemplary structure during various stages of a third exemplary manufacturing method in which a ball bond packaging option (e.g., BGA, FPBGA) is selected. Generally, the cross-sectional views show a cross-section of a third embodiment of the structure 500 in FIG. 5A, taken along the A-A' axis.

Figure 8A:
FIGS. 8A-8D show cross-sectional views of an IC during various stages of manufacturing in accordance with a third embodiment of the invention.

Referring now to FIG. 8A, first and second bump pad sections 710 and 712 may be formed by depositing, then photolithographically patterning and etching, a layer of metal on substrate 700. A wire bond pad (not shown) may be formed at the same time. Substrate 700 generally comprises an outer (or exposed) insulator layer, under which or adjacent to which may be located active circuit components, such as busses, conductive (metal) traces, resistors, fuses, etc., in addition to input/output and/or protective circuitry as explained above. As shown in FIG. 8A, the metal may comprise aluminum and may be deposited by sputtering. Alternatively, first and second bump pad sections 710 and 712 may be formed by damascene metal formation (e.g., patterning and etching an upper insulator layer in substrate 700), in which case the bulk metal may comprise copper (and the structure will not appear identical to that shown in FIG. 8A).

Figure 8B:

As shown in FIG. 8B, an insulator or passivation layer 720 (as described above for insulator layer 530) is deposited onto the structure in FIG. 8A (generally by CVD, as described elsewhere herein). After deposition, the passivation layer 720 may be planarized (e.g., by polishing or CMP, reflow, etchback, etc.). At this point, the manufacturer still has all possible packaging options available, since no ball bond has been formed over the first and second bump pad sections 710 and 712. Also, after formation of the passivation layer 720, most (or all) conventional wafer manufacturing flows may be considered complete.

Figure 8C:
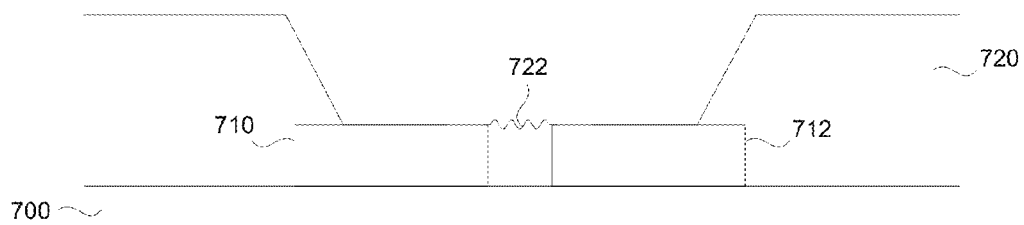

Upon depositing the passivation layer 720, a masking layer 725 (generally known as a pad open mask) is then deposited over the passivation layer 720 and then patterned. Then, as shown in FIG. 8C, an opening 724 is formed in passivation layer 720, generally by conventional photolithography and either etch back or a selective etch of the passivation layer 720. In the embodiment of FIG. 8C, openings 724 generally leave disconnection portion 722 in place (e.g., between first and second bump pad sections 710 and 712). Thus, the end point for etching the passivation layer 720 is generally a predetermined period of time (for either etch back of selective etch, when one knows with reasonable certainty the etch rate of the passivation layer 720 under the etch conditions used) or a reflectance or absorption of a predetermined wavelength of light known to have a significantly different reflectivity or absorption for the material of bump pad sections 710 and 712 relative to the material of passivation layer 720. In addition, opening 724 exposes the bump pad sections 710, 712 which may later be electrically connected to each other.

The slope of the sidewalls of opening 724 may be slightly exaggerated in the case of FIG. 8C. In many cases, the slope may be more perpendicular to the plane of first and second bump pad sections 710 and 712 (e.g., closer to the range of 80-87°). However, in most commercial applications, the slope of the sidewalls of the bump pad openings (e.g., 724) should be less than 90°, to provide a somewhat concave "cup" in which parts (or all) of a subsequent solder ball or solder bump may fit relatively securely. Subsequent processing steps and structures formed over the bump pad sections 710 and 712 may be considered a first step in the packaging process.

Figure 8D:
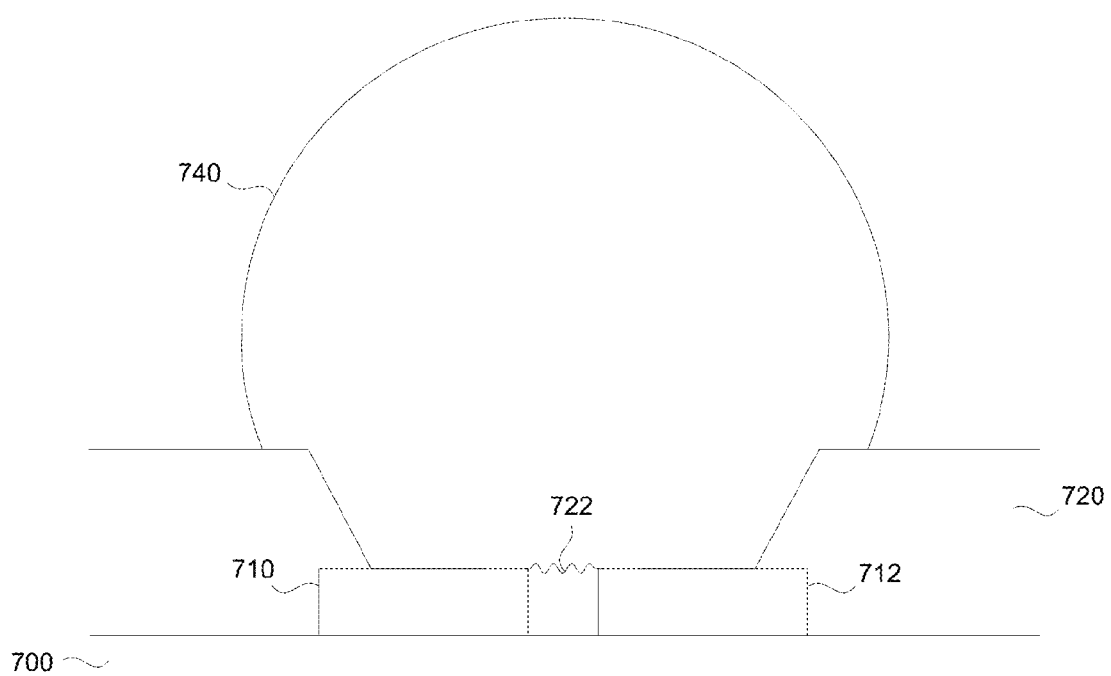

To improve adhesion of a subsequently formed ball bond to first and second bump pad sections 710 and 712, or of a wire bond to a bond pad (not shown), a conductive adhesive material may be selectively deposited (e.g., by electroplating, electroless plating or epitaxial deposition) thereon, forming bumping metal layer portions 730 and 732 (see FIG. 8D). Finally, FIG. 8D shows the structure having a ball bond 740 conventionally attached thereto. Ball bond 740 connects the first and second bump pad sections 710 and 712 so that they are electrically coupled or shorted.

Alternatively, the semiconductor or IC manufacturer and/ or designer may select a wire bond packaging option by electrically connecting a wire bond to a bond pad (not shown). In such a case, the bump pad sections retain the electrical disconnection therein (between the first and second bump pads 710 and 712), and do not further contain a ball bond electrically connecting the first and second bump pads to each other. In other words, a ball bond is not formed over the first and second bump pads.

An Exemplary Integrated Circuit

In a further embodiment, the present invention relates to an integrated circuit or semiconductor device, comprising the present structure (largely as described above) and a substrate physically supporting the structure. Such an integrated circuit or semiconductor device may further comprise a plurality of integrated circuit components or semiconductor devices thereon (e.g., I/O circuits 350, 352, 450, 452, 454, and/or 456 of FIGS. 3A-3B, or other circuitry, such as one or more memory blocks or arrays, [micro]processor blocks, signal processing blocks, logic functions or arrays, timing circuits, etc.). In addition, the integrated circuit or semiconductor device may further comprise a packaging material (e.g., a packaging substrate, which may comprise a lead frame when a wire bond packaging option is selected or a conventional ball bonding substrate when a ball bonding packaging option is selected, and a conventional epoxy material to encapsulate the IC) surrounding the substrate and the structure.

Exemplary Software

Embodiments of the present invention may also include algorithms, computer program(s) and/or software, implementable and/or executable in a general purpose computer or workstation equipped with a conventional (digital) signal processor or other processing device, configured to place a bump pad having a plurality of disconnected sections and a plurality of bond pads in an upper metal layer, each such bond pad configured for electrical connection to one of the bump pad sections, and route a plurality of conductive traces in the upper metal layer, each trace adapted to electrically connect one of the bond pads to the corresponding bump pad section. Thus, a further aspect of the exemplary embodiments relates to algorithms and/or software that implement the above design(s) and/or layout(s). For example, the embodiments may further relate to a computer program, computer-readable medium or waveform containing a set of instructions which, when executed by an appropriate processing device (e.g., a signal processing device, such as a microcontroller, microprocessor or DSP device), is configured to place IC devices and/or structures and route signal paths therebetween, as such structures and signal paths are generally described herein and/or are known in the art.

For example, the computer program may be on any kind of readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

In various embodiments, the computer program or waveform contains one or more instructions to select a ball bond packaging option or a wirebond packaging option. For example, the instruction(s) to select the ball bond packaging option may cause an integrated circuit assembly and/or packaging apparatus to form a solder bump or solder ball on or over the bump pad, thereby electrically connecting the plurality of bump pad sections. Alternatively, the instruction(s) to select the wire bond packaging option may cause the integrated circuit assembly and/or packaging apparatus to form a wire bond to at least a subset of the bond pads.

An Exemplary Method of Selecting an IC Packaging Option

In a further aspect, embodiments of the present invention relate to a method of selecting a packaging option, comprising the steps of forming, from an uppermost metal layer on a device, a bump pad having a plurality of electrically disconnected sections therein, a plurality of bond pads (each configured for electrical connection to a bump pad section), and a plurality of conductive traces, each trace adapted to electrically connect one of the bond pads to the corresponding bump pad section, and forming either (i) a wire bond to at least one of the bond pads, or (ii) a ball bond to the bump pad, thereby electrically connecting the bump pad sections to each other. Thus, there is overlap between the methods of manufacturing a device having multiple packaging options available for selection, as described above.

In one embodiment, a ball bond packaging option may be selected by attaching a ball bond or solder ball onto the bump pad. In most cases, a bumping metal is deposited onto the plurality of bump pad sections, such that the bumping metal contains electrical disconnections therein. The electrical disconnections in the bumping metal may (and preferably do) correspond to the bump pad sections. To select a wire bond packaging option, one simply forms a wire bond to at least one of the bond pads. Optionally, the method may form a wire bond to at least two of the bond pads, or to each of the bond pads in the plurality of bond pads. In general, the method further comprises forming an opening over the plurality of bond pads and/or the bump pad before the forming step, depending on which packaging option is selected and the desired and/or available number of "pad open" masks. For example, when only one "pad open" mask is used, openings are formed over both the bond pads and the bump pads, and the bonding option is chosen as described herein.

CONCLUSION/SUMMARY

Thus, embodiments of the present invention may provide a structure, methods and software for configuring an integrated circuit for multiple packaging types and/or selecting one of a plurality of packaging types for an integrated circuit. Embodiments of the present invention may advantageously provide reduced manufacturing costs by using a common mask for the level of metal (typically the uppermost such level) used for forming pads in various packaging options. Embodiments of the present invention may also reduce inventory management issues by enabling one device to be manufactured at a wafer level for a plurality of different packaging options, thereby enabling packaging decisions to be made at a later time in the manufacturing process (e.g., immediately prior to packaging). Thus, embodiments of the present invention may provide significant and/or commercially important benefits to integrated circuit designers, manufacturers, and sellers/distributors.

The foregoing descriptions of specific embodiments of the present invention have been presented for purposes of illustration and description. They are not intended to be exhaustive or to limit the embodiments to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method, comprising:
 forming, from an uppermost metal layer of an integrated circuit,
  a bump pad comprising a plurality of bump pad sections, wherein the plurality of bump pad sections are physically disconnected from each other, and wherein the bump pad is configured for formation of one of a solder bump or a solder ball on the bump pad,
  a plurality of bond pads, wherein each bond pad of the plurality of bond pads is configured for electrical connection to a corresponding bump pad section of the plurality of bump pad sections, and wherein each of the plurality of bond pads is configured for receiving a corresponding wire bond, and
  a plurality of conductive traces, wherein each conductive trace of the plurality of conductive traces is configured to electrically connect a corresponding bond pad of the plurality of bond pads to the corresponding bump pad section; and
 forming an insulation layer over the uppermost metal layer of the integrated circuit, wherein the insulation layer covers the bump pad and the plurality of bond pads.

2. The method of claim 1, wherein the insulation layer comprises an uppermost passivation layer of the integrated circuit.

3. The method of claim 1, further comprising:
 forming a first opening in the insulation layer over a first bond pad of the plurality of bond pads; and
 forming a wire bond to the first bond pad of the plurality of bond pads through the first opening.

4. The method of claim 1, further comprising: wherein: forming (i) a first opening in the insulation layer over a first bump pad section of the plurality of bump pad sections and (ii) a second opening in the insulation layer over a second bump pad section of the plurality of bump pad sections; the one or more openings 3re located over the bump pad; and
 forming one of (i) the solder bump on the bump pad to thereby electrically connect the plurality of bump pad sections or (ii) the solder ball over the bump pad to thereby electrically connect the plurality of bump pad sections.

5. The method of claim 1, wherein forming the bump pad comprises:
 depositing a bumping metal onto the plurality of bump pad sections; and
 forming one or more electrical disconnections in the bumping metal over the bump pad.

6. The method of claim 1, further comprising:
 forming one of the solder bump or the solder ball on the bump pad without connecting any wire bond to the plurality of bond pads.

7. The method of claim 1, further comprising:
 connecting each of the plurality of bond pads to the corresponding wire bond without forming any solder bump or solder ball on the bump pad.

8. A method, comprising:
 forming, from an uppermost metal layer on an apparatus,
  a bump pad comprising a plurality of bump pad sections, wherein the plurality of bump pad sections are physically disconnected from each other, and wherein the bump pad is configured for formation of one of a solder bump or a solder ball on the bump pad,
  a plurality of bond pads, wherein each bond pad of the plurality of bond pads is configured for electrical connection to a corresponding bump pad section of the plurality of bump pad sections, and wherein each of the plurality of bond pads is configured for receiving a corresponding wire bond, and
  a plurality of conductive traces, wherein each conductive trace of the plurality of conductive traces is adapted configured to electrically connect a corresponding bond pad of the plurality of bond pads to the corresponding bump pad section.

9. The method of claim 8, wherein the apparatus further comprises an uppermost passivation layer over the uppermost metal layer, and wherein the method further comprises:

prior to forming one of the wire bond, the ball bond, or the solder ball, forming an opening in the uppermost passivation layer over one of (i) the plurality of bond pads or (ii) the bump pad.

10. The method of claim 8, wherein forming the wire bond comprises selecting a wire bond packaging option, and wherein forming the ball bond or the solder ball comprises selecting a bond packaging option.

11. A method, comprising:
   forming a bump pad comprising (i) a first bump pad section and (ii) a second bump pad section, wherein the first bump pad section and the second bump pad section are physically disconnected from each other, and wherein the bump pad is configured for formation of one of a solder bump or a solder ball on the bump pad;
   forming (i) a first bond pad and (ii) a second bond pad, wherein each of the first bond pad and the second bond pad is configured for receiving a corresponding wire bond;
   forming a first conductive trace, wherein the first conductive trace is configured to electrically connect the first bump pad section to the first bond pad, and
   forming a second conductive trace, wherein the second conductive trace is configured to electrically connect the second bump pad section to the second bond pad.

12. The method of claim 11, further comprising:
   forming an insulation layer over (i) the first bump pad section, (ii) the second bump pad section, (iii) the first bond pad, and (iv) the second bond pad.

13. The method of claim 12, further comprising:
   performing only one of:
      (i) forming an opening in the insulation layer over the first bump pad section, or
      (ii) forming the opening in the insulation layer over the first bond pad.

14. The method of claim 11, further comprising:
   forming (i) a first opening in the insulation layer over the first bond pad and (ii) a second opening in the insulation layer over the second bond pad; and
   forming the wire bond to the first bond pad.

15. The method of claim 11, further comprising:
   forming an opening in the insulation layer over the bump pad; and
   forming one of (i) the solder bump on the bump pad to thereby electrically connect the first bump pad section and the second bump pad section or (ii) the solder ball over the bump pad to thereby electrically connect the first bump pad section and the second bump pad section.

16. The method of claim 11, wherein forming the bump pad comprises:
   depositing (i) a first bumping metal onto the first bump pad section and (ii) a second bumping metal onto the second bump pad section,
   wherein the first bumping metal and the second bumping metal are separated by an insulation layer.

17. The method of claim 11, wherein the first bump pad section and the second bump pad section are physically disconnected from each other via an insulation layer.

18. The method of claim 11, further comprising:
   forming an insulation layer over (i) the first bump pad section, (ii) the second bump pad section, (iii) the first bond pad, and (iv) the second bond pad;
   forming (i) a first opening in the insulation layer substantially directly over the first bond pad and (ii) a second opening in the insulation layer substantially directly over the second bond pad; and
   refraining from forming any opening in the insulation layer substantially directly over the bump pad.

19. The method of claim 18, wherein the bump pad, the first bond pad, and the second bond pad are included in an integrated circuit, and wherein refraining from forming any opening in the insulation layer substantially directly over the bump pad comprises:
   refraining from forming any opening in the insulation layer substantially directly over the bump pad while and subsequent to a packaging of the integrated circuit.

20. The method of claim 11, wherein the bump pad, the first bond pad, and the second bond pad are included in an integrated circuit, and wherein the method further comprises:
   forming an insulation layer over (i) the first bump pad section, (ii) the second bump pad section, (iii) the first bond pad, and (iv) the second bond pad;
   forming an opening in the insulation layer substantially directly over the bump pad; and
   refraining from forming any opening in the insulation layer substantially directly over the first bond pad and the second bond pad while and subsequent to a packaging of the integrated circuit.

* * * * *